(12) United States Patent
Küsters et al.

(10) Patent No.: US 6,590,249 B2
(45) Date of Patent: Jul. 8, 2003

(54) ONE-TRANSISTOR MEMORY CELL CONFIGURATION AND METHOD FOR ITS FABRICATION

(75) Inventors: Karl Heinz Küsters, Boxdorf (DE); Dietmar Temmler, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/166,813

(22) Filed: Jun. 11, 2002

(65) Prior Publication Data

US 2003/0025140 A1 Feb. 6, 2003

(30) Foreign Application Priority Data

Jun. 11, 2001 (DE) .......................... 101 28 193

(51) Int. Cl.⁷ ............................. H01L 27/108
(52) U.S. Cl. .............. 257/301; 257/304; 438/243; 438/386
(58) Field of Search .............. 257/301, 304; 438/243, 386

(56) References Cited

U.S. PATENT DOCUMENTS

| 5,442,211 A | 8/1995 | Kita |
|---|---|---|
| 5,627,092 A | 5/1997 | Alsmeier et al. |
| 5,914,510 A | 6/1999 | Hieda |
| 5,998,821 A | * 12/1999 | Hieda et al. ............. 257/301 |
| 6,236,079 B1 | 5/2001 | Nitayama et al. |
| 6,306,719 B1 | * 10/2001 | Lee ......................... 438/387 |

OTHER PUBLICATIONS

IBM Disclosure Bulletin: "Fabrication Method To Offset The Self–Aligned Vertical Connection Over The Trench Capacitor", vol. 32, No. 3B, Aug. 1989, pp. 163–168.

* cited by examiner

*Primary Examiner*—David Nelms
*Assistant Examiner*—Tu-Tu Ho
(74) *Attorney, Agent, or Firm*—Laurence A. Greenberg; Werner H. Stemer; Ralph E. Locher

(57) ABSTRACT

In a method for fabricating a dynamic memory cell in a semiconductor substrate having a trench capacitor 1 and a selection transistor 2 and a semiconductor memory having such a memory cell, a dielectric insulator layer 17, 201 is formed between the selection transistor and the trench capacitor, a first electrode region 203 of the selection transistor essentially being arranged above a block-type inner electrode 102 of the trench capacitor and being connected to said electrode via a contact opening 213 in the dielectric insulator layer, said contact opening being provided with an electrically conductive filling layer 214.

11 Claims, 4 Drawing Sheets

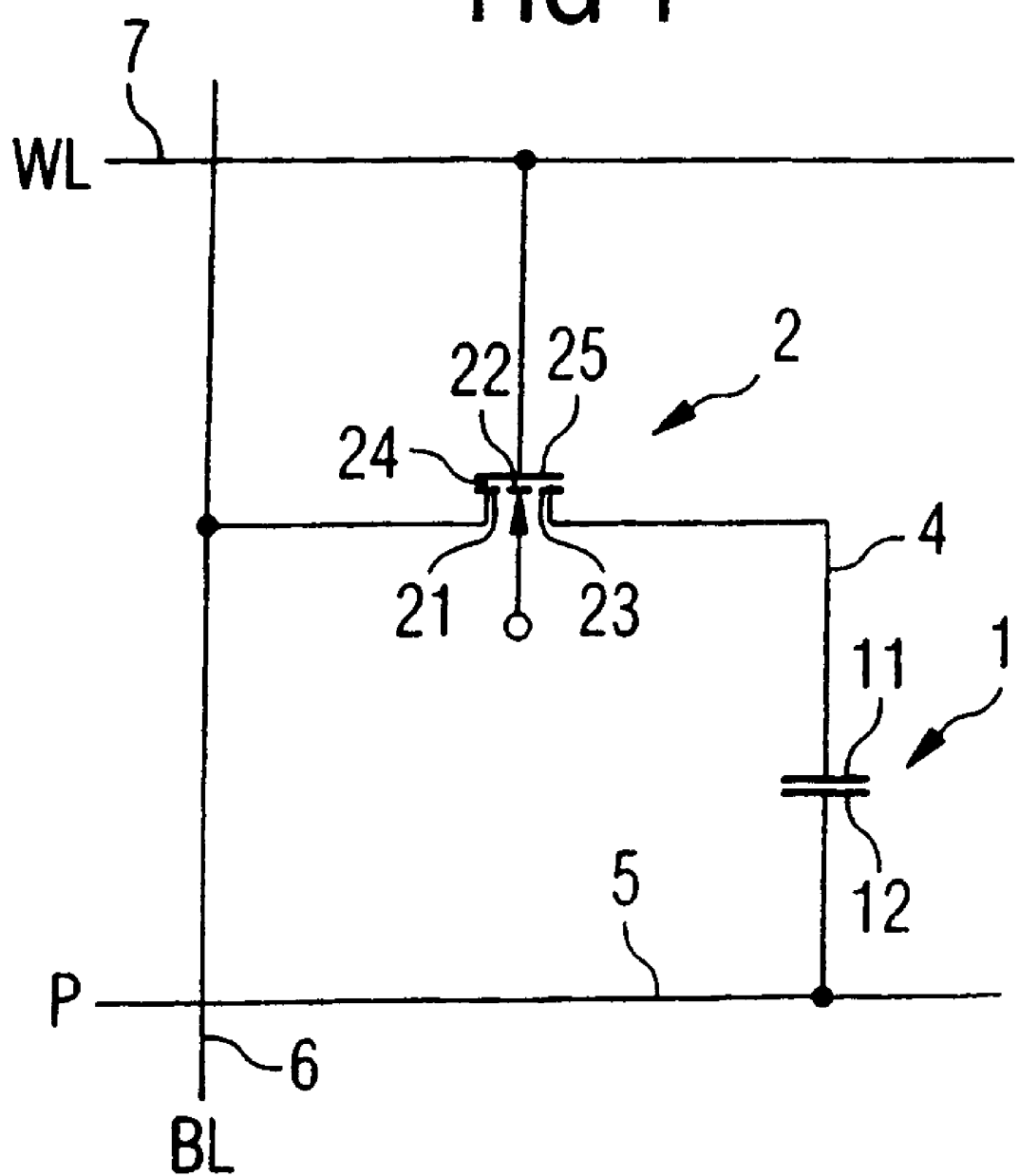

ONE-TRANSISTOR MEMORY CELL CONFIGURATION AND METHOD FOR ITS FABRICATION

BACKGROUND OF THE INVENTION

Field of the Invention

The invention relates to a method for fabricating a dynamic memory cell in a semiconductor substrate having a trench capacitor and a selection transistor, and to a semiconductor memory having such a memory cell.

In dynamic random access memories (DRAMs), use is predominantly made of one-transistor memory cells which are each composed of a selection transistor and a storage capacitor, the information being stored in the storage capacitor in the form of electric charges. In this case, a DRAM memory comprises a matrix of such memory cells which are connected up in the form of rows and columns. Usually, the row connections are designated as word lines and the column lines are designated as bit lines. In this case, the selection transistor and the storage capacitor in the memory cell are connected to one another in such a way that when the selection transistor is driven via a word line, the charge of the storage capacitor can be read in and out via a bit line.

The one-transistor memory cell must satisfy essentially three basic requirements. The storage capacitor must have a sufficiently large storage capacitance of approximately 25 to 40 fF per cell, in order to obtain reliable charge detection of the stored charge and thus an adequate read signal. On account of the increasing miniaturization, it is furthermore necessary to create a packing-dense cell layout which is convenient for fastening and with which the area requirement for the memory cell can be greatly limited. Furthermore, it is necessary that, on the one hand, a sufficient current flows via the selection transistor for reading the storage charges in and out into the storage capacitor and, on the other hand, the selection transistor reliably blocks in the switched-off state. In particular, these parameters of the selection transistor must not be adversely affected by a very close proximity to the storage capacitor or by the required contact between the selection transistor and the storage capacitor.

One focus of attention in the technological development of DRAM memories is the storage capacitor. In order to provide for an adequate storage capacitance in the context of the continually decreasing cell area from technology generation to technology generation for the memory cell, storage capacitors which utilize the third dimension have been developed. Such three-dimensional storage capacitors are often embodied as trench capacitors in DRAM cells. In the case of such trench capacitors, a trench is etched into the semiconductor substrate and is filled with a dielectric layer and a first storage electrode, a doped region of the semiconductor substrate serving as second storage electrode. The selection transistor of the DRAM cell is then usually formed on the planar semiconductor surface by the trench capacitor.

On account of the advancing miniaturization of the memory cells, even in the case of the trench capacitors further possibilities are sought for simultaneously reducing the area requirement and increasing the capacitor capacitance. One possibility is to increase the depth of the trenches in order to obtain a larger capacitor capacitance. Technological limits are imposed in this case, however, on account of very high aspect ratios (ratio of trench depth to trench width). As an alternative and in addition to further deepening of the trenches, methods are used which allow the surface area within the trench capacitor to be increased by additional extension in the lower trench region. However, the etching processes required for such extension of the trenches likewise encounters technological limits.

Furthermore, for the purpose of increasing the capacitance in trench capacitors, very thin storage dielectrics having a high dielectric constant are also used as dielectric intermediate layers between the capacitor electrodes and materials which are distinguished by a particularly high conductivity are chosen for the capacitor electrodes.

In addition to the further development of the trench capacitors, however, the selection transistor of the memory cell is also the subject of technological development. In order to increase the performance of the selection transistor in the memory cell, the doping profiles for forming the electrode regions and the channel region and also the well bounding the selection transistor are optimized. In addition, use is also made of improved insulator layers for delimiting the channel region from the gate region and optimizations of the thermal budget are performed. Additional approaches involve avoiding defects in the formation of the selection transistor in the semiconductor substrate and improved processes for the connection of the electrode regions of the selection transistors by low-impedance connection contacts.

A further objective in improving the memory cells is to avoid reciprocal influencing of trench capacitor and selection transistor due to their very close proximity. In this case, there is the risk of a parasitic transistor being formed along the trench capacitor. In order to eliminate such a parasitic transistor, use is made, in particular, of a thick oxide collar for insulating the outer capacitor electrode from the selection transistor. This has the disadvantage that it is necessary to produce a deep trench for the trench capacitor with a correspondingly high aspect ratio.

U.S. Pat. No. 6,236,079 B1 discloses a method for fabricating a dynamic memory cell and a corresponding semiconductor memory having a dynamic memory cell in accordance with the preamble of claims 1 and 5, respectively. IBM Disclosure Bulletin, Vol. 32, No. 3B, pages 163 to 168, describes a similar method and a similar semiconductor memory. Further relevant fabrication methods and semiconductor memories are presented in U.S. Pat. No. 5,914,510, U.S. Pat. No. 5,627,092 and U.S. Pat. No. 5,442,211.

SUMMARY OF THE INVENTION

It is an object of the present invention to provide a method for fabricating a dynamic memory cell in a semiconductor substrate and a corresponding memory cell in which particularly small trench diameters can be achieved whilst maintaining the storage capacitance, at the same time the performance of the selection transistor not being impaired by the proximity to the trench capacitor.

This object is achieved by means of a method according to claim 1 and a semiconductor memory according to claim 5. Preferred refinements are specified in the dependent claims.

According to the invention, a dielectric insulator layer is formed between a selection transistor and a trench capacitor, a first electrode region of the selection transistor essentially being arranged above a block-type layer electrode of the trench capacitor and being connected to said electrode via a contact opening in the dielectric insulator layer, said contact opening being provided with an electrically conductive filling layer.

The configuration according to the invention with a dielectric insulation layer between the selection transistor and the trench capacitor makes it possible for these two active components in the memory cell to be completely electrically isolated from one another with the exception of the contact-connection via the electrically conductive filling layer and thus for the risk of a vertical parasitic transistor between the selection transistor and the trench capacitor to be reliably prevented. In particular, the dielectric layer makes it possible to dispense with an insulation collar which is usually formed at the upper section of the trench in the trench capacitor in order to prevent a parasitic transistor between the selection transistor and the trench capacitor, so that essentially the entire depth of the trench can be utilized as active memory area. As a result of this, compared with conventional trench capacitors with an insulation collar, whilst ensuring the same capacitor capacitance, trenches with a smaller aspect ratio can be formed, as a result of which the fabrication process can be significantly simplified. A further simplification of the fabrication process is also achieved by virtue of the fact that the time-consuming and expensive process required for forming the insulation collar in the case of conventional trench capacitors can be dispensed with in favor of a simple process of deposition of an insulation layer.

According to the invention, the dielectric insulator layer between the selection transistor and the trench capacitor is produced with the aid of the wafer bonding method. This wafer bonding method, in which preferably a first thin insulator layer is applied to the semiconductor substrate provided with the trench capacitor and a second semiconductor substrate is furthermore provided with a second thin dielectric insulator layer, the two semiconductor substrates with their insulator layers being brought one on top of the other in order to produce a mechanically fixed connection between the dielectric insulator layers by wafer bonding, makes it possible to produce a particularly thin and uniform dielectric insulator layer between the selection transistor and the trench capacitor.

In accordance with one preferred embodiment, the selection transistor is formed in the second semiconductor substrate used, after the wafer bonding method. This makes it possible to fabricate the selection transistor using SOI technology, with which transistors having a particularly fast switching behavior can be produced.

In accordance with a further preferred embodiment, the contact opening provided with a dielectric filling layer is formed in a self-aligning manner between the first electrode region of the selection transistor and the block-type inner electrode of the trench capacitor, the insulation encapsulation of the word line region of the selection transistor preferably being used as an etching mask for forming the contact opening. As a result of this, the contact-connection between the selection transistor and the trench capacitor can be realised in a simple manner. The invention is explained in more detail with reference to the accompanying drawings.

BRIEF DESCRIPTION OF THE DRAWINGS

In the drawings,

FIG. 1 shows a circuit diagram of a dynamic memory cell in a DRAM; and

DESCRIPTION OF THE PREFERRED EMBODIMENTS

Figure 2A:
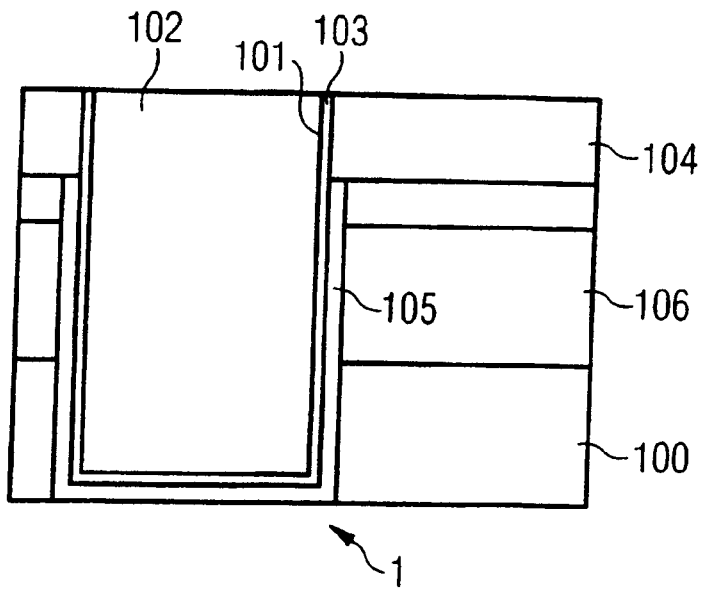
FIGS. 2A to 2E show an embodiment of a method according to the invention for fabricating a DRAM memory cell according to the invention.

The invention is explained using a process sequence for the formation of a dynamic memory cell in a DRAM memory. The individual structures of the dynamic memory cell are preferably formed with the aid of silicon planar technology, which comprises a sequence of individual processes acting in each case in a whole-area manner on the surface of a silicon semiconductor wafer, a local alteration of the silicon substrate being carried out in a targeted manner via suitable masking layers. During the DRAM memory fabrication, a multiplicity of dynamic memory cells are simultaneously formed in the process. However, in the text below, the invention is described only with regard to the formation of an individual dynamic memory cell.

In DRAM memories, use is predominantly made of a one-transistor memory cell whose circuit diagram is shown in FIG. 1. This one-transistor memory cell comprises a storage capacitor 1 and a selection transistor 2. In this case, the selection transistor 2 is preferably formed as a field-effect transistor and has a first source/drain electrode 21 and a second source/drain electrode 23, between which an active region 22 is arranged. Arranged above the active region 22 are a gate insulator layer 24 and a gate electrode 25, which act like a plate capacitor by which the charge density in the active region 22 can be influenced in order to form or to block a current-conducting channel between the first electrode 21 and the second electrode 23.

The second electrode 23 of the selection transistor 2 is connected to a first electrode 11 of the storage capacitor 1 via a connecting line 4. A second electrode 12 of the storage capacitor 1 is in turn connected to a capacitor plate 5, which is preferably common to all the storage capacitors of the DRAM memory cell arrangement. The first electrode 21 of the selection transistor 2 is further connected to a bit line 6 in order that the information stored in the storage capacitor 1 in the form of charges can be read in and out. In this case, the read-in and -out operation is controlled via a word line 7, which is simultaneously the gate electrode 25 of the selection transistor 2 in order to produce a current-conducting channel in the active region 22 between the first electrode 21 and the second electrode 23 by application of a voltage.

In dynamic memory cells, in many cases trench capacitors are used as storage capacitors, since a significant reduction of the memory cell area can be achieved by virtue of the three-dimensional structure. However, with increasing miniaturization of the memory cells with a scaling size of at most 100 nm, additional measures are necessary in order to be able to satisfy the three basic requirements made of a dynamic memory cell in a DRAM memory: a sufficiently large storage capacitance of approximately 25 to 40 fF for reliable detection of the charges stored in the trench capacitor; a packing-dense, structurally convenient cell layout which provides for a minimum chip area and thus for reduced costs; and a high performance of the selection transistor and an adequate read-in and -out current and a sufficiently low blocking current.

In this case, one difficulty in the context of the advancing miniaturization of the chip area is, in particular, the very close proximity between trench capacitor and selection transistor and also the required electrical connection between the trench capacitor and the selection transistor, which can adversely influence principally the functionality of the selection transistor. In particular, there is the risk of a vertical parasitic field-effect transistor arising at the upper section of the trench capacitor between the outer electrode of the trench capacitor and the selection transistor electrode adjacent to the trench capacitor.

In order to prevent such an undesirable parasitic transistor without having to perform additional patterning of the trench capacitor or restriction of the storage capacitance thereof, according to the invention a thin dielectric insulator layer is arranged between the trench capacitor and the selection transistor, which insulator layer completely electrically isolates the two active components of the dynamic memory cell. The necessary connection of the trench capacitor to the selection transistor is effected via a contact opening which is provided with an electrically conductive filling layer and connects the—essentially arranged one above the other—inner electrode of the trench capacitor to the first electrode of the selection transistor.

FIGS. 2A to E show a possible process sequence for the fabrication of a memory cell according to the invention using silicon planar technology, the cross sections illustrated showing the silicon wafer in each case after the last individual process described. In this case, only the process steps for forming the dynamic memory cell which are essential to the invention are discussed below. Unless described otherwise the structures are otherwise formed in the context of customary DRAM process technology.

FIG. 2A shows a detail from a silicon semiconductor wafer 100, in which a trench capacitor 1 is embodied. The silicon wafer 100 is preferably a monocrystalline silicon substrate which in this case is preferably doped in a weakly p-type manner (p⁻) e.g. with boron. A trench 101 embodied in the silicon substrate 100 is preferably filled with polysilicon 102, which is doped in a highly n-type manner (n⁺) e.g. with arsenic or phosphorus. This polysilicon filling 102 forms the inner electrode of the trench capacitor.

The polysilicon filling 102 in the trench 101 is preferably completely enclosed by a storage dielectric layer 103. This storage dielectric layer 103 may comprise the stack of dielectric layers, e.g. oxide, nitride-oxide, or oxide-nitride-oxide, which are distinguished by a high dielectric constant. A dielectric insulator layer 104 is further provided on the silicon substrate 100 and completely encloses an upper section of the trench 101 with the polysilicon filling 102 and the storage dielectric layer 103. SiO₂ is preferably used as the dielectric insulator layer 104.

An n⁺-doped layer 105, which is doped for example with arsenic, is formed in the lower region of the trench 101 around the polysilicon filling 102 and the storage dielectric layer 103. This n⁺-doped layer 105 serves as outer electrode of the trench capacitor 1 and is connected to a buried plate 106, which constitutes a likewise n⁺-doped layer and serves as capacitor plate for the connection of the outer electrode of the trench capacitor 1.

The trench capacitor shown in FIG. 2A is preferably formed with the aid of known silicon planar technology. In this case, the silicon substrate 100 is patterned with the aid of known lithography and etching techniques.

The SiO₂ layer used as dielectric insulator layer 104 is preferably deposited on the silicon surface with the aid of the TEOS method. In this case, the SiO₂ layer 104 preferably serves as the lower part of an etching mask during the etching of the trench 101, so that after the formation of the trench 101 or after the introduction of the storage dielectric layer 103 and the polysilicon filling 102, the SiO₂ layer 104 completely encloses the latter. The use of the SiO₂ layer 104 thus enables the trench capacitor to be formed in a self-aligning manner.

Figure 2B:
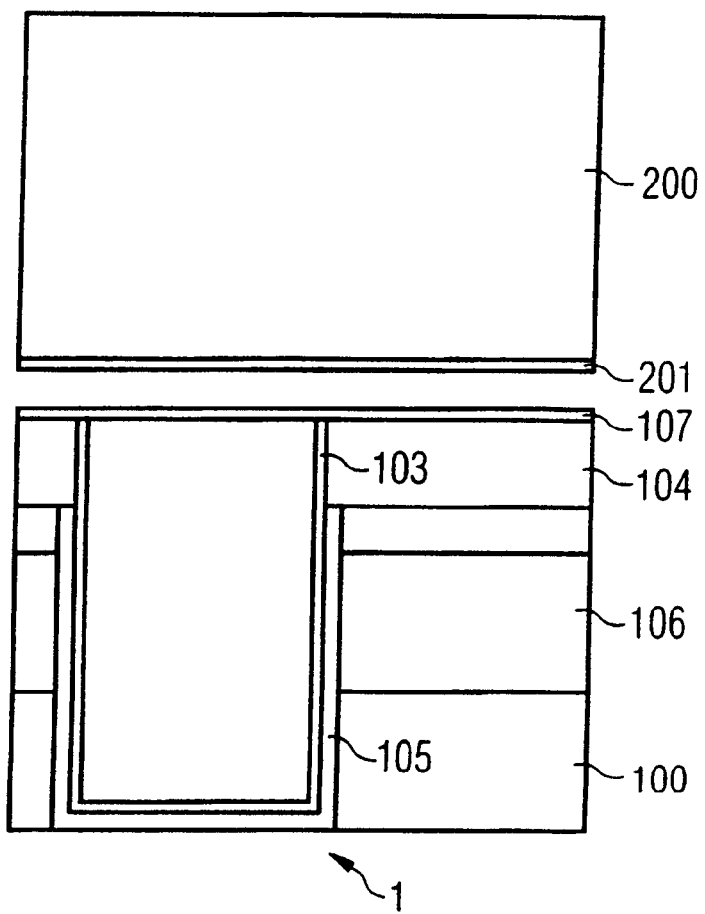

After the formation of the trench capacitor 1, in a further process step, a thin dielectric insulator layer 107 is deposited, as is shown in FIG. 2B. In this case, the thin dielectric insulator layer 107 made of SiO₂ is preferably produced by thermal oxidation of a thin silicon layer. As illustrated in FIG. 2B, in parallel with the production of the dielectric insulator layer 107 on the silicon substrate 100, a further thin dielectric insulator layer 201 is formed on a further silicon substrate 200, which is likewise preferably monocrystalline and doped in a weakly p-type manner (p⁻) e.g. with boron. This further thin dielectric insulator layer 201 is again preferably composed of SiO₂ produced by thermal oxidation of the silicon surface.

Figure 2C:
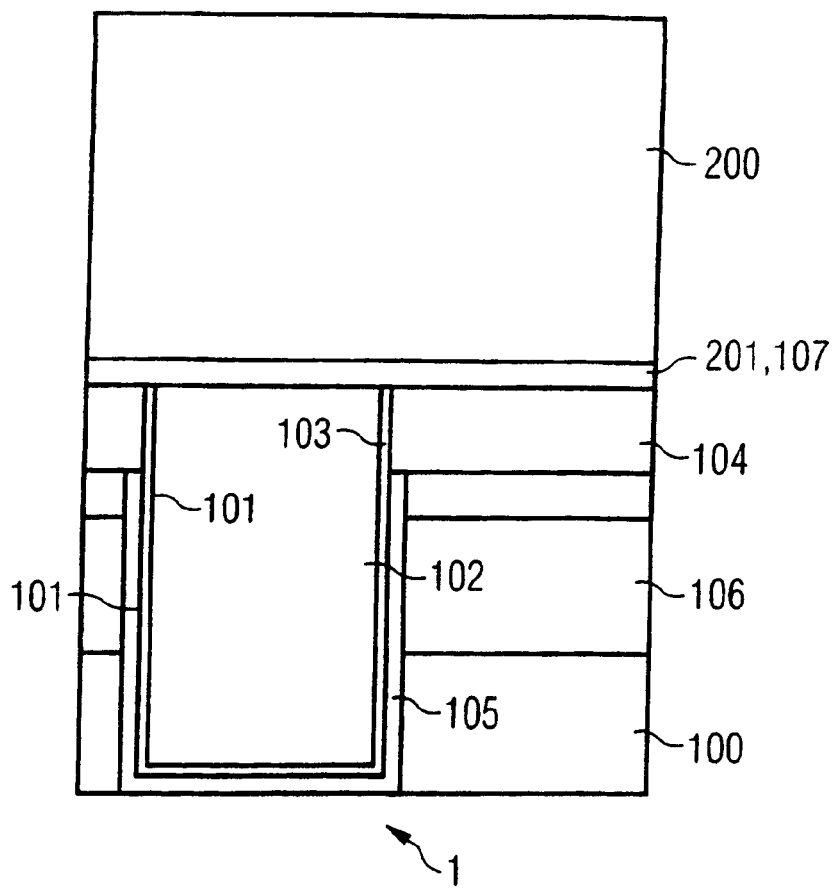

The two silicon substrates 100, 200 are then connected to one another in a nonreleaseable manner in the context of a wafer bonding process, as is shown in FIG. 2C. To that end, as revealed in FIG. 2B, the two silicon substrates 100, 200 with their thin SiO₂ layers 107, 201 are firstly pressed against one another, the two SiO₂ layers 107, 201 entering into weak adhesion with one another. This weak adhesion of the two SiO₂ layers 107, 201 is then converted to a fixed mechanical connection by anodic bonding or by a thermal step.

The fixed connection of the two SiO₂ layers 107, 201 can be produced by applying a voltage of approximately 500 V to the two silicon substrates 100, 200 at a relatively low temperature of approximately 500° C. in the context of the anodic bonding. As an alternative, however, a thermal oxidation in a pure oxygen atmosphere at approximately 1000° C. can also be carried out in order to produce a fixed connection between the SiO₂ layers 107, 201. The wafer bonding makes it possible to produce a whole-area disturbance-free connection between the insulator layers 107, 201.

Figure 2D:
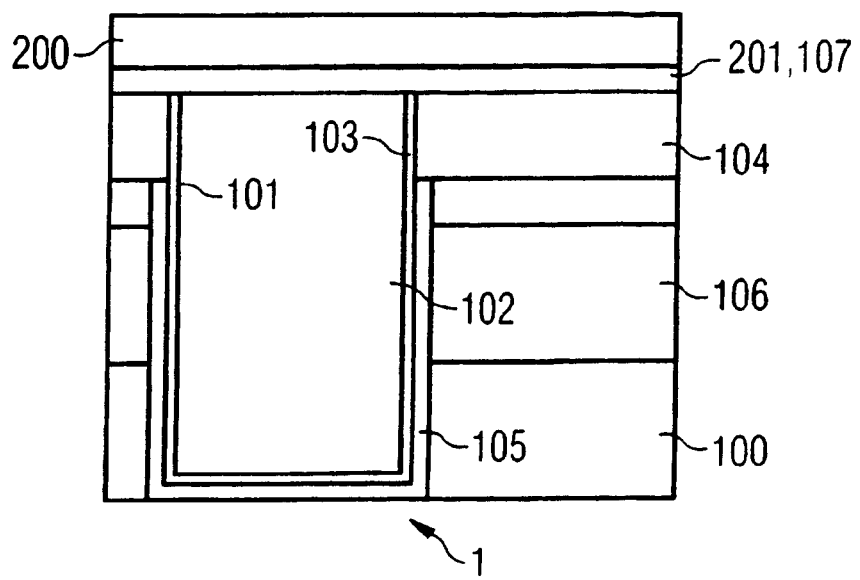

After the connection of the two silicon substrates 100, 200, the selection transistor 2 is then formed in the silicon substrate 200. For this purpose, by means of the known techniques, i.e. by means of a grinding process, etching-back process, smart-cut process or another eroding method, a back-preparation of the silicon substrate 200 to the thickness required for the integration of the selection transistor is performed, as shown in FIG. 2D. The formation of the selection transistor on an insulating support, which is known as SOI technology, has the advantage that the quality of the silicon substrate in which the selection transistor is formed corresponds to the quality of the starting wafer, since no crystal defects are produced in the context of the wafer bonding method. Selection transistors fabricated using SOI technology are distinguished in particular by a particularly fast switching behavior.

The wafer bonding process for forming the dielectric insulator layer between the selection transistor and the trench capacitor furthermore makes it possible to set the thickness of the dielectric insulator layer between the two active elements within wide limits and to adapt it to the desired memory cell layout. In particular, the wafer bonding process produces a high-quality electrical insulator layer between the trench capacitor and the selection transistor, so that even a small layer thickness already results in complete electrical insulation and thus the prevention of an undesirable vertical parasitic transistor between the outer electrode of the trench capacitor and doping regions of the selection transistor. In particular in the case of the trench capacitor, it is possible to dispense with the conventionally required formation of an oxide collar in the upper region of the trench in the trench capacitor, so that essentially the entire trench depth can be utilized as active memory area and, consequently, even with a small trench depth will already achieve the storage capacitance required for reliable charge detection in the trench capacitor.

After the back-preparation process of the silicon wafer 200, in order to form the selection transistor 2, in a first step, an ultraplanar field insulation region 202 is produced in a section of the silicon substrate 200. This serves for the electrical insulation of the selection transistor 2 from selection transistors of adjacent memory cells.

After the introduction of the field insulation region 202, the selection transistor is formed, preferably with the aid of known silicon planar technology, with two n+-doped diffusion regions 203, 204, which are produced by the implantation of e.g. arsenic into the silicon substrate 200 and are interrupted by a channel 205. An n+-doped gate stack 207 is formed above the channel 205 in a manner isolated by a gate dielectric 206. Said gate stack preferably comprises n+-doped polysilicon and a layer sequence with tungsten. The gate stack 207 simultaneously serves as word line.

Above the field insulation region 202, a further word line 208 is arranged parallel to the gate stack 207. A third word line 209 runs on the silicon substrate 200 beside the first diffusion region 203. These first, second and third word lines 207, 208, 209 are in each case enclosed by an insulation encapsulation 210, 211, 212, preferably composed of $Si_3N_4$, which are in turn covered with a thin stop layer, preferably likewise made of $Si_3N_4$.

Between the first word line 207 and the second word line 208, in a manner adjoining the field insulation region 202, a contact trench 213 is etched through the silicon substrate and the underlying connected dielectric insulator layer 107, 201. This contact trench 213 enables a connection of the polysilicon filling 102 and thus of the inner electrode of the trench capacitor 1 to the second n+-doped diffusion region 204 of the selection transistor 2. The contact trench 213 has a chimney-shaped contact filling 214, which is composed of n+-doped polysilicon and is in contact with the polysilicon filling 102 of the trench capacitor 1.

This contact filling 214 is surrounded by an insulation collar 215, preferably made of $SiO_2$, in a lower region of the contact trench 213 and has a conductive cap 216 in an upper region. This conductive cap 216 is in turn preferably likewise composed of n+-doped polysilicon and connects the contact filling 214 to the second n+-doped diffusion region 204 of the selection transistor 2. The contact trench 214 thus produces a self-aligning connection between the trench capacitor 1 and the selection transistor 2, the first and second word lines 207, 208 with their insulation encapsulations 210, 211 and their stop layer 213 advantageously being used as an etching mask for the formation of the contact trench 213.

Figure 2E:
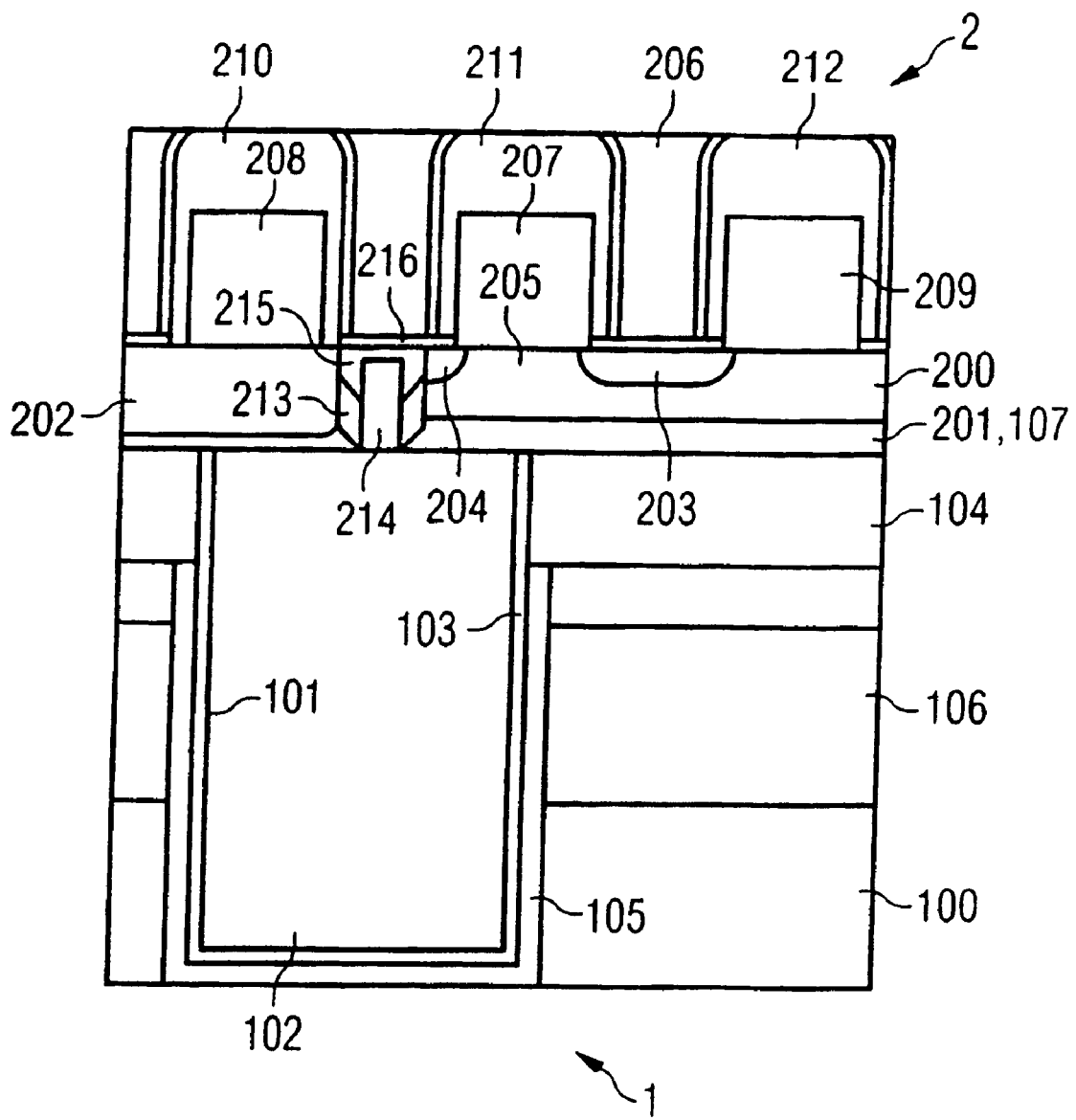

In this case, in the contact window formed between the two word lines, firstly the silicon substrate 200 is removed in the region of this contact window with the aid of an anisotropic silicon etching process, the etching stopping on the connected dielectric insulator layer 107, 201. Afterward, in a further etching process, the connected dielectric insulator layer 107, 201 is cut through and then the insulation collar 215 and the contact filling 214 and also the electrical cap 216 are fabricated. Finally, the contact window region between the first and second word lines 207, 208 is covered again with the stop layer 213 and closed and planarized with a further insulator deposition. A cross section through the memory cell after the end of this process sequence is shown in FIG. 2E. In a subsequent process sequence a bit line contact and also bit line and further metallization planes are then fabricated in a known manner.

With the aid of the presented techniques according to the invention, it is possible to produce, in a simple manner, a dielectric insulator layer for completely isolating the trench capacitor and the selection transistor in a memory cell. The necessary connection between the trench capacitor and the selection transistor is then preferably effected via a self-aligning chimney-shaped connection which penetrates through the dielectric insulator layer. What is advantageous about this technique, in which the dielectric insulator layer is preferably embodied with the aid of the wafer bonding method, is that essentially the entire depth of the trench can be utilized as active memory area for the trench capacitor and even with a thin dielectric insulator layer a possible parasitic transistor between the trench capacitor and the selection transistor is already avoided. Furthermore, the selection transistor can be formed on the dielectric insulator layer using known SOI technology, as a result of which it is possible to achieve an improved transistor performance.

It lies within the scope of the invention, over and above the exemplary embodiments mentioned above, to modify the specified dimensions, concentrations, materials and processes in a suitable manner in order to fabricate the memory cell according to the invention. In particular it is possible in this case to have recourse to all known process sequences for the formation of trench capacitors in particular in the context of DRAM fabrication processes. Furthermore, it is possible to embody the conductivity type of the doped regions in the memory cell in a complementary fashion. What is more, the specified materials for forming the various layers can be replaced by other materials known in this connection.

The features of the invention disclosed in the above description, the drawings and the claims may be of importance both individually and in any desired combination for the realisation of the invention in its various configurations.

We claim:

1. A method for fabricating a dynamic memory cell, which comprises:
    in a first semiconductor substrate, forming a trench capacitor having a blocked-type inner electrode, a dielectric intermediate layer surrounding the inner electrode, and an outer electrode at least partly surrounding the electric intermediate layer;
    forming a dielectric insulator layer by:
        applying a first thin dielectric insulator layer on the first semiconductor substrate, applying a second thin dielectric insulator layer on a second semiconductor substrate, pressing the second thin dielectric insulator layer of the second semiconductor substrate against the first thin dielectric insulator layer of the first semiconductor substrate, and obtaining a mechanically fixed connection by using a wafer bonding method;
    in the second semiconductor substrate, forming a selection transistor having a first electrode region configured essentially above the block-type inner electrode of the trench capacitor, a channel region, a second electrode region, a control electrode, and insulator layer isolating the control electrode from the channel region; and
    forming a contact opening in the dielectric insulator layer and providing the contact opening with an electrically conductive filling layer such that the contact opening connects the first electrode region of the selection transistor to the block-type inner electrode of the trench capacitor;
    the dielectric insulator layer being located between the selection transistor and the trench capacitor.

2. The method according to claim 1, which comprises:
    performing the step of forming the selection transistor in the second semiconductor substrate, after performing the wafer bonding method; and
    before performing the step of forming the selection transistor, performing a back-preparation step on the second semiconductor substrate to obtain a thickness required for forming the selection transistor.

3. The method according to claim 1, which comprises performing the step of forming the trench capacitor by:
    depositing a dielectric insulator layer on the first semiconductor substrate;

using the dielectric insulator layer that has been deposited as a mask for etching a trench of the trench capacitor in order to completely enclose the trench capacitor in a self-aligning manner; and forming a buried doping region serving as the outer electrode, a thin storage dielectric serving as the dielectric intermediate layer, and a trench filling serving as the inner electrode.

4. The method according to claim 1, which comprises:

forming word lines; and performing the step of forming the contact opening by using a self-aligning contact window process in a region between two of the word lines.

5. A semiconductor memory, comprising:

a first semiconductor substrate formed with a first thin dielectric insulator layer; and a second semiconductor substrate formed with a second thin dielectric insulator layer;

said first thin dielectric insulator layer and said second thin dielectric insulator layer being mechanically fixedly connected to form a dielectric insulator layer;

said first semiconductor substrate formed with a trench capacitor;

said second semiconductor substrate formed with a selection transistor;

said trench capacitor and said selection transistor forming a dynamic memory cell;

said trench capacitor having a block-type inner electrode, a dielectric intermediate layer surrounding said inner electrode, and an outer electrode layer at least partly surrounding said dielectric intermediate layer;

said selection transistor having a first electrode region, an insulator layer, a control electrode, a channel region isolated from said control electrode by said insulator layer of said selection transistor, and a second electrode region;

said dielectric insulator layer isolating said selection transistor from said trench capacitor;

said dielectric insulator layer formed with a contact opening provided with an electrically conductive filling layer; and said first electrode region of said selection transistor essentially being configured above said block-type inner electrode of said trench capacitor and being connected to said block-type inner electrode via said contact opening in said dielectric insulator layer.

6. The semiconductor memory according to claim 5, comprising:

a further dielectric insulator layer;

said trench capacitor having a buried doping region serving as said outer electrode, a thin storage dielectric serving as said dielectric intermediate layer and a trench filling serving as said inner electrode;

said buried doping region being configured below said further dielectric insulator layer; and said thin storage dielectric and said trench filling having an upper region completely enclosed by said further dielectric insulator layer.

7. The semiconductor memory according to claim 5, wherein:

said second semiconductor substrate has a semiconductor layer configured on said dielectric insulator layer;

said dielectric insulator layer covers said trench capacitor; and said first electrode region, said channel region and said second electrode region of said selection transistor are formed in said semiconductor layer of said second semiconductor substrate.

8. The semiconductor memory according to claim 7, comprising:

an adjacent memory cell having a selection transistor;

said semiconductor layer formed with a field insulation region for laterally insulating said selection transistor of said dynamic memory cell from said selection transistor of said adjacent memory cell.

9. The semiconductor memory according to claim 7, wherein: said semiconductor layer is formed with a field insulation region for laterally insulating said selection transistor.

10. The semiconductor memory according to claim 5, comprising:

two word lines configured in said second semiconductor substrate;

said contact opening being configured between said two word lines.

11. The semiconductor memory according to claim 5, comprising:

a collar layer;

said contact opening being configured on said block-type inner electrode of said trench capacitor;

said electrically conductive filling layer of said contact opening having a lower region and an upper region;

said lower region of said electrically conductive filling layer being laterally dielectrically insulated by said collar layer; and said upper region of said electrically conductive filling layer contact-connecting said first electrode region of said selection transistor.

* * * * *